United States Patent [19]

Hall

[11] Patent Number: 5,395,099
[45] Date of Patent: Mar. 7, 1995

[54] TOOLING PIN ASSEMBLY

[76] Inventor: James F. Hall, 5576 Castlebar Pl., Alta Loma, Calif. 91701

[21] Appl. No.: 987,196

[22] Filed: Dec. 8, 1992

[51] Int. Cl.[6] .............................................. B23Q 3/06
[52] U.S. Cl. ..................................................... 269/47
[58] Field of Search .......................... 81/124.4, 124.5; 269/47, 50–52, 309, 903

[56] References Cited

U.S. PATENT DOCUMENTS

| | | |
|---|---|---|
| 3,598,392 | 8/1971 | Williamson et al. ................ 269/47 |
| 3,638,934 | 2/1972 | Blum et al. ............................. 269/52 |
| 4,700,488 | 10/1987 | Curti et al. ......................... 269/48.4 |
| 4,840,094 | 6/1989 | Macor ................................. 81/124.5 |
| 5,157,995 | 10/1992 | Nogues ............................... 81/124.5 |

Primary Examiner—Robert C. Watson
Attorney, Agent, or Firm—John J. Connors

[57] ABSTRACT

A tooling pin assembly 10 is mounted on a test platen 12 having a planar surface 12b which supports a circuit board 16 under test. The tooling pin assembly 10 includes a locating pin 20 which engages the circuit board 16 to fix the relative position of predetermined test sites on the circuit board 16 and a lid assembly having probes 22 that contact these sites during testing when said circuit board 16 and lid assembly are in correct alignment. Mounting means for the locating pin 20 enables the locating pin to be manually relocated to compensate for minor irregularities of test sites, or in the fixture, or both.

7 Claims, 9 Drawing Sheets

TOOLING PIN ASSEMBLY

BACKGROUND OF THE INVENTION

1. Field of the Invention

This invention relates to a tooling pin assembly used to position an object in a reference position, and particularly, a tooling pin assembly which allows an operator to adjust manually the position of a locating pin in the assembly to compensate for minor irregularities of test sites on the object or in the fixture, or both.

2. Background Discussion

It is common practice to test circuit boards using a bed of pins type test fixture such as illustrated in U.S. Pat. Nos. 4,340,858 and 4,701,703. The circuit boards are relatively flat, planar structures which have a number of test sites at different locations on the board's surface. The bed of pins type test fixture has probes which engage these test sites during testing. Electrical current is passed through the probes and test sites, and passes through an electronic analyzer to determine if the circuits on the boards are constructed properly.

The probes are mounted on a lid assembly, and the circuit board is positioned on a flat platen so that the test sites and the tips of the probes are in registration and make physical contact during testing. There are locating holes in the perimeter of the circuit board, and stationary locating pins mounted along the perimeter of the platen which pass through these holes when the circuit board is placed on the test platen. This positions the test sites on the circuit board in registration with the probes. Sometimes there are minor irregularities in the circuit board or the test fixture, so that the probes do not properly engaged the test sites and either miss the test sites or contact a corner rather than the center of the test sites. These minor irregularities do not prevent the board from functioning, but only prevent reliable testing of the board. Minor irregularities result from art work shifts, solder mask encroachment on the test sites, fixture assembly errors, negative accumulation of dimensional tolerances, etc.

SUMMARY OF THE INVENTION

It is the objective of this invention to provide a tooling pin assembly which has a locating pin whose position may be manually adjusted to compensate for minor irregularities of the test sites on an object under test, or the test fixture, or both. According to this invention the locating pin is mounted to be manually repositioned at a selected one of a plurality of predetermined, spaced apart, alternate positions disposed along a plurality of eccentric paths to compensate for irregularities in the test sites or fixture, or both.

The tooling pin assembly of this invention has several features, no single one of which is solely responsible for its desirable attributes. Without limiting the scope of this invention as expressed by the claims which follow, its more prominent features will now be discussed briefly. After considering this discussion, and particularly after reading the section entitled, "DETAILED DESCRIPTION OF THE PREFERRED EMBODIMENT," one will understand how the features of this invention provide its advantages, which include ease of assembly and use, elimination of costly and time consuming retooling of fixtures, substantial saving attained by manually adjusting the locating pin to compensate for irregularities of test sites or in the fixture, and flexibility in adapting fixtures to change over between different production runs.

The first feature of the tooling pin assembly of this invention is that it may be used with any object that has sites that are to be contacted by a work element such as the probes of a bed of pins test fixture. It is adapted to be removably mounted on a test platen having a planar surface which carries the object, for example in the case of a circuit board, the planar surface of a test platen. As with conventional tooling pin assemblies, this invention includes a locating pin which engages the circuit board to fix the relative position of the object and a work element. Thus, the test sites and work element are nominally in correct alignment.

The second feature of this invention is that the locating pin is mounted to be manually relocated to compensate for minor irregularities associated with the test sites. The mounting means for the locating pin includes a body member mounted on the platen in a predetermined location and orientation. The body member has a first receptacle with a first side wall including a plurality of parallel channels disposed substantially parallel to a first receptacle longitudinal axis. This first receptacle longitudinal axis is centrally located and is substantially at a right angle to the planar surface of the platen upon mounting the tooling pin assembly to the platen. The locating pin may be spring biased so that it may be moved in and out of the plane of the platen, or it may be mounted in a fixed position.

The third feature is a housing which is removably disposed within the first receptacle and has first locating indicia thereon and an outer side wall. This outer side wall includes a plurality of corner segments that engage the channels in the first receptacle and slide along these channels upon relative sliding movement between the housing and the first receptacle. The position of the housing within the first receptacle is manually changeable as required to align correctly, for example, the circuit board and the lid assembly. The position of the first locating indicia provides a visual indication of the position of the housing within the first receptacle. Preferably, the outer side wall of the housing has a hexagonal configuration.

The fourth feature is that the housing has a second receptacle with a second side wall. This second side wall includes a plurality of parallel channels disposed substantially parallel to a second receptacle longitudinal axis that is substantially at a right angle to the planar surface upon mounting the tooling pin assembly to the platen. The second receptacle longitudinal axis is offset relative to a central longitudinal axis of the housing.

The fifth feature is that the locating pin is removably received within a mounting member, and this mounting member is removably disposed within the second receptacle. The locating pin mounting member has a second locating indicia thereon, an outer side wall including a plurality of corner segments that engage the channels in the second receptacle and slide along these channels upon relative sliding movement between the locating pin mounting member and the second receptacle, and a third longitudinal axis that is substantially at a right angle to the planar surface upon mounting the tooling pin assembly to the test platen. The locating pin is coaxial with the third longitudinal axis, and the third longitudinal axis is offset relative to a central longitudinal axis of the locating pin mounting member. Preferably, the outer side wall of the locating pin mounting member has a hexagonal configuration.

The sixth feature is that the parallel channels in the first side wall are formed by a pair of coaxial hexagonal shaped wall structures rotated relative to each other 30°, and the parallel channels in the second side wall are formed by a pair of coaxial hexagonal shaped wall structures rotated relative to each other 30°.

According to this invention, a novel method of testing an object is also provided. This method includes the steps of (a) mounting the tooling pin assembly on the platen so that the locating pin may be manually repositioned at a selected one of a plurality of predetermined, spaced apart alternate, fixed positions to enable the locating pin to be positioned precisely and repeatedly, (b) determining by trial and error techniques whether the probes of a work element are in registration with the test sites, and (c) when the probes are not in registration with the test sites, repositioning the locating pin to a selected, alternate position where the probes are in registration with the test sites.

Preferably, the alternate, fixed positions are disposed along a plurality of eccentric paths to compensate for irregularities of test sites, or in the test fixture, or both,

BRIEF DESCRIPTION OF THE DRAWING

The preferred embodiment of this invention, illustrating all its features, will now be discussed in detail. This embodiment depicts the novel and non-obvious method and device of this invention shown in the accompanying drawing, which is for illustrative purposes only. This drawing includes the following figures (Figs.), with like numerals indicating like parts.

DESCRIPTION OF THE PREFERRED EMBODIMENT

Figure 1:
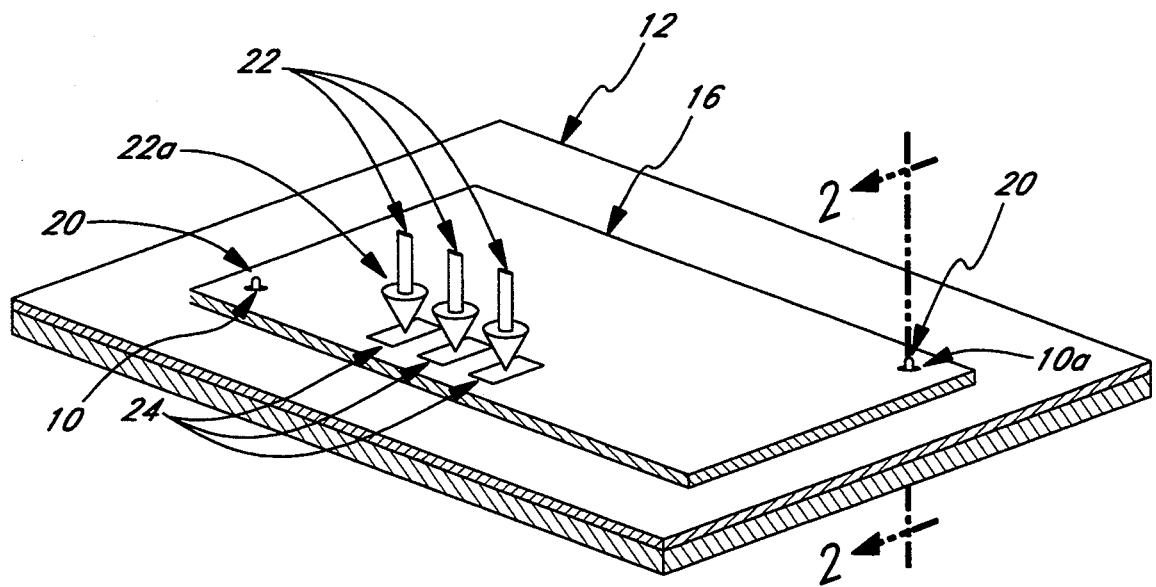
FIG. 1 is a perspective view of a circuit board resting on a test platen of a bed of pins type test fixture.
Figure 2:
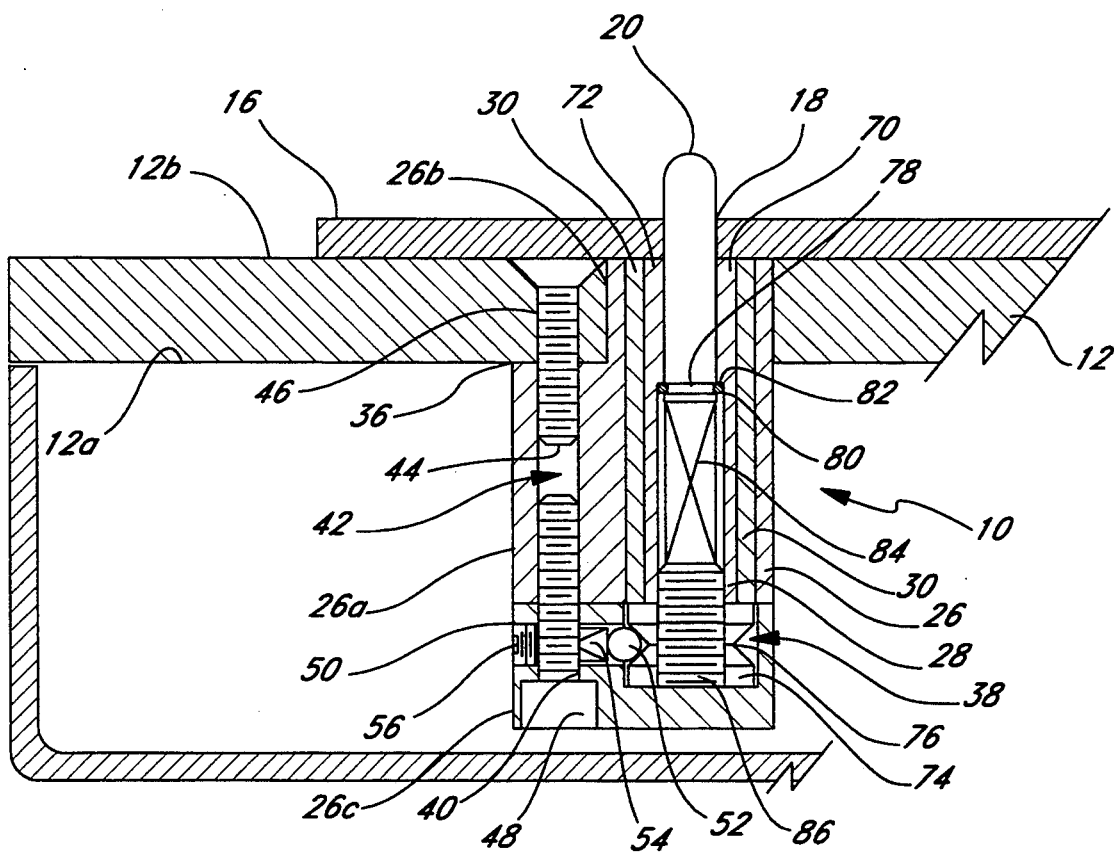
FIG. 2 is a cross-sectional view taken along 2—2 of FIG. 1.

As best shown in FIGS. 1 through 3 and FIGS. 14 and 15A and 15B, there are a pair of identical tooling pin assemblies 10 and 10a of this invention located at diagonally opposed corners of a test platen 12 of a bed of pins test fixture used for testing a circuit board 16. (The tooling pin assemblies 10 and 10a may be located in other positions beside the diagonal position illustrated, and more than two assemblies may be used.) The circuit board 16 has locating holes 18 (FIG. 2) in its opposed corners which allow a locating pin 20 in the tooling pin assembly 10 to pass through these holes and locate the circuit board in a fixed reference position on the test platen 12. A lid assembly (not shown), including a plurality of pins or probes depicted as arrows 22, is positioned over the test platen 12. (The probes 22 may also be located beneath or in a sideways relationship to a circuit board under test.) During testing, the lid assembly moves towards the circuit board 16, so that the tips 22a of the probes 22 engage test sites 24 on the circuit board. For various reasons, these test sites 24 are not always properly aligned with the probes 22, so that the tips 22a of the probes do not make proper contact with the test sites. If such misalignment is not too great, for example, typically within a range of from about 0.010 to about 0.020 inch, the tooling pin assembly 10 allows the locating pin 20 to be moved to compensate for this misalignment, allowing the probes 22 to then correctly contact the test sites 24.

The tooling pin assembly 10 of this invention includes a body 26, a locating pin mounting member 28, and a housing 30 which is received within a receptacle 32 in the body. The housing 30 includes a receptacle 34 which receives the locating pin mounting member 28, which in turn contains the locating pin 20.

The body 26 includes a cylindrical base 26a, with a raised cylindrical head 26b extending upward from a ledge 36 and a bottom cover 26c. The bottom cover 26c includes a cavity 38 and an opening 40 which is aligned with a threaded, elongated opening 42 in the base 26a. An upper screw 44 passes through a hole 46 in the test platen 12 and is screwed into the threaded, elongated opening 42 in the base 26a to hold the body 26 in position underneath the test platen 12, with the ledge 36 bearing snugly against the underside 12a of the test platen. The upper screw 44 is recessed as shown, and the head 26b has a height which corresponds to the thickness of the test platen 12, so that the upper rim 46 of the head 26b is essentially flush with the planar surface 12b of the test platen. Alternately, if the thickness of the platen 12 is less than the height of the head 26b, spacers may be positioned between the underside of the test platen 12 and the ledge 36. The cover 26c is held into position by a lower screw 48 screwed into the threaded, elongated opening 42. There is a passageway 50 in the cover 26c which receives a ball 52 that is biased by a spring 54 and held in position by a set screw 56. The body receptacle 32 extends through the head 26b and base 26a, and it has a plurality of channels 60 in its side wall 62 as shown in FIGS. 2, 3, 4 and 5. These channels 60 are formed by two wall structures which are on a common axis a and rotated 30° to provide a 12 pointed star-like cross-section. The axis a is offset with respect to the central longitudinal axis f of the base 26a.

Figure 3:
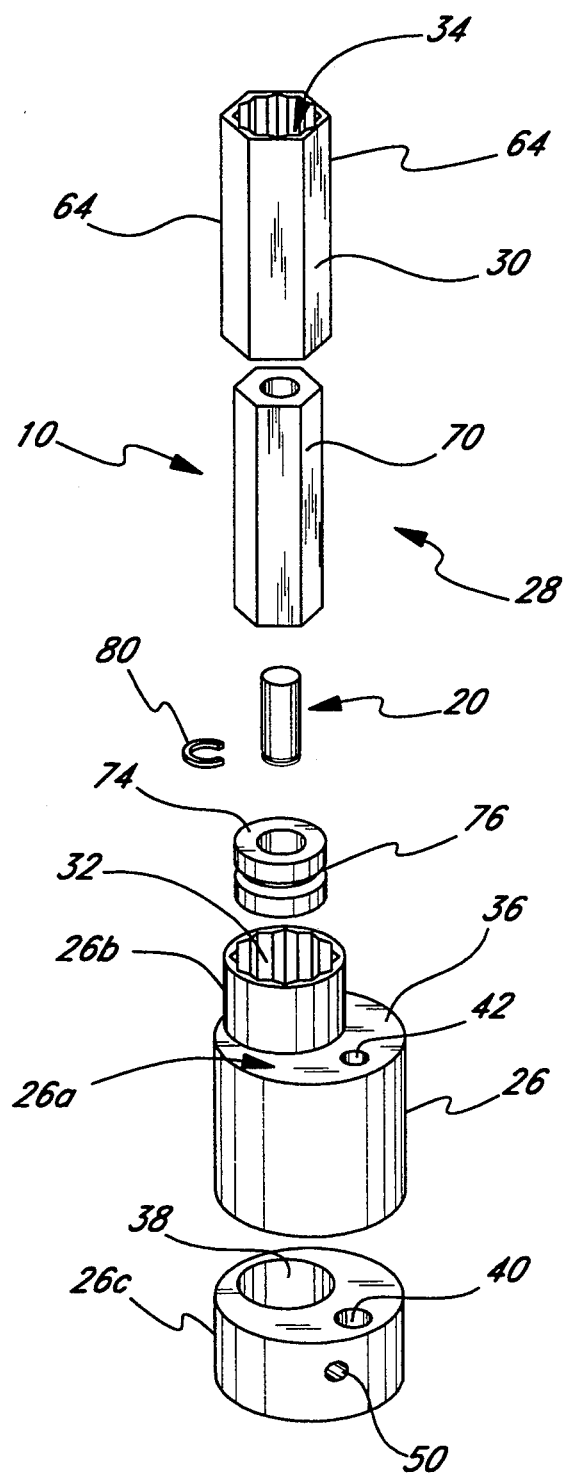
FIG. 3 is an exploded perspective view of the tooling pin assembly of this invention.
Figure 4:
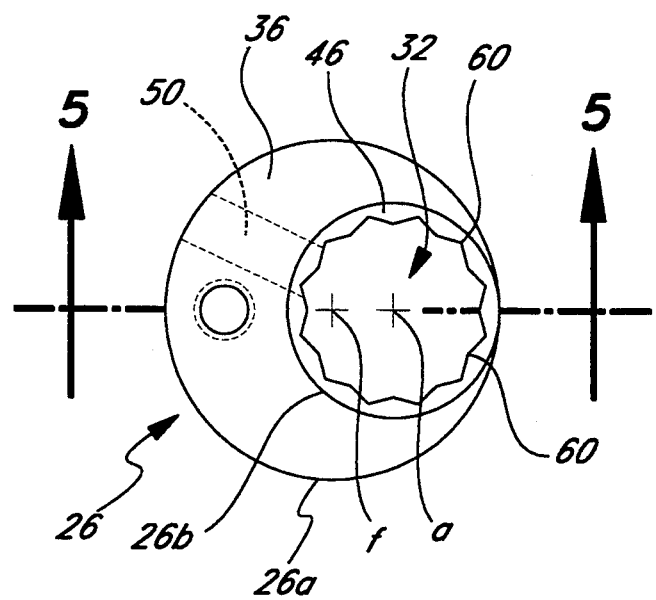
FIG. 4 is a plan view of the body of the tooling pin assembly of this invention, with the housing and locating pin mounting member removed.
Figure 5:
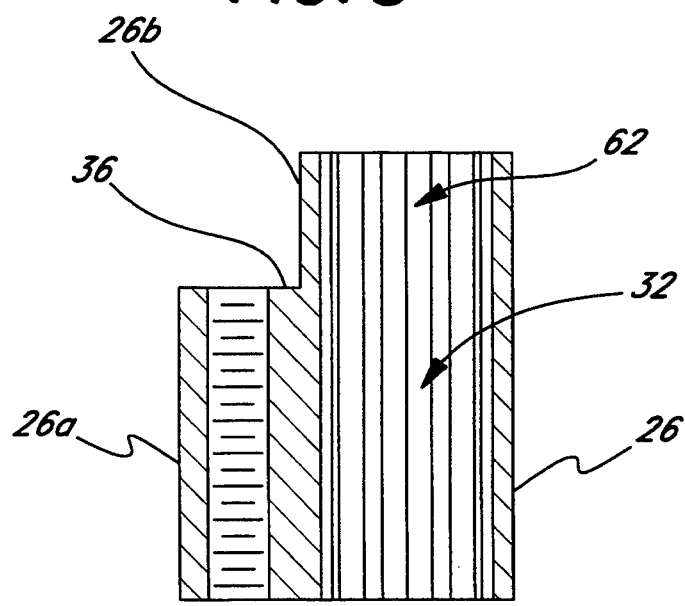
FIG. 5 is a cross-sectional view taken along line 5—5 of FIG. 4.
Figure 6:
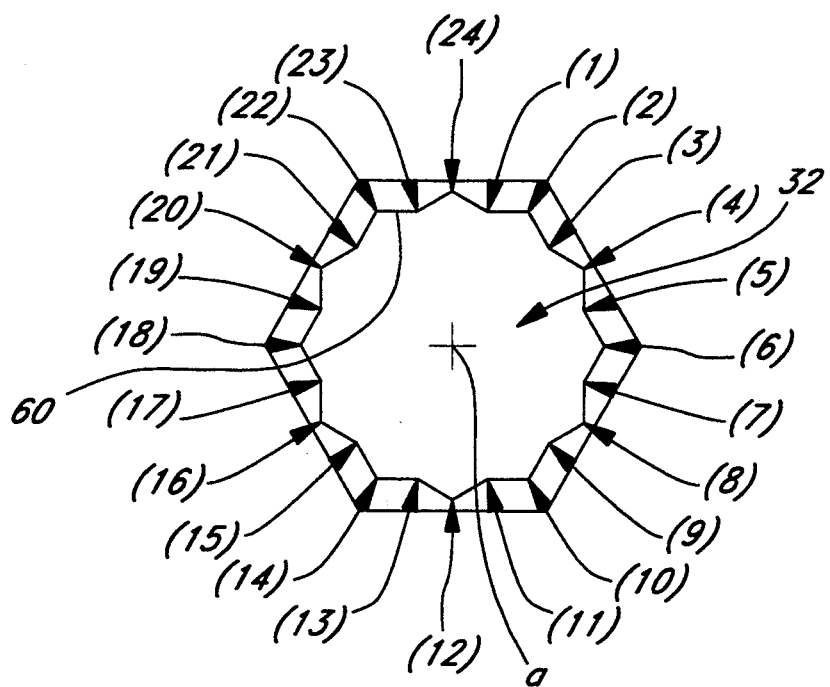
FIG. 6 is an enlarged plan view of the receptacle for the housing.
Figure 7:
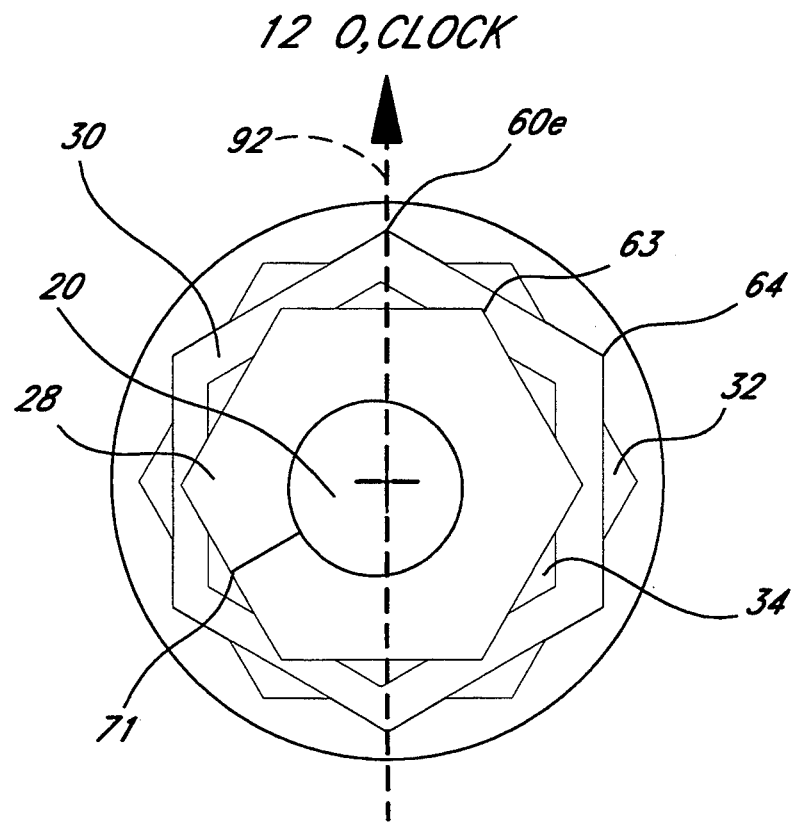
FIG. 7 is an enlarged plan view showing the housing and locating pin mounting member received within the receptacle of the body.
Figure 8:
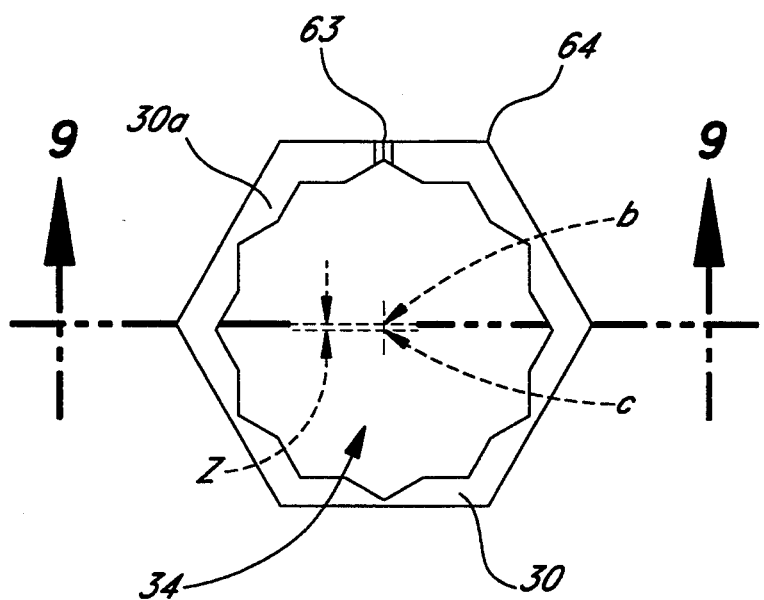
FIG. 8 is a plan view of the housing of the tooling pin assembly of this invention.
Figure 9:
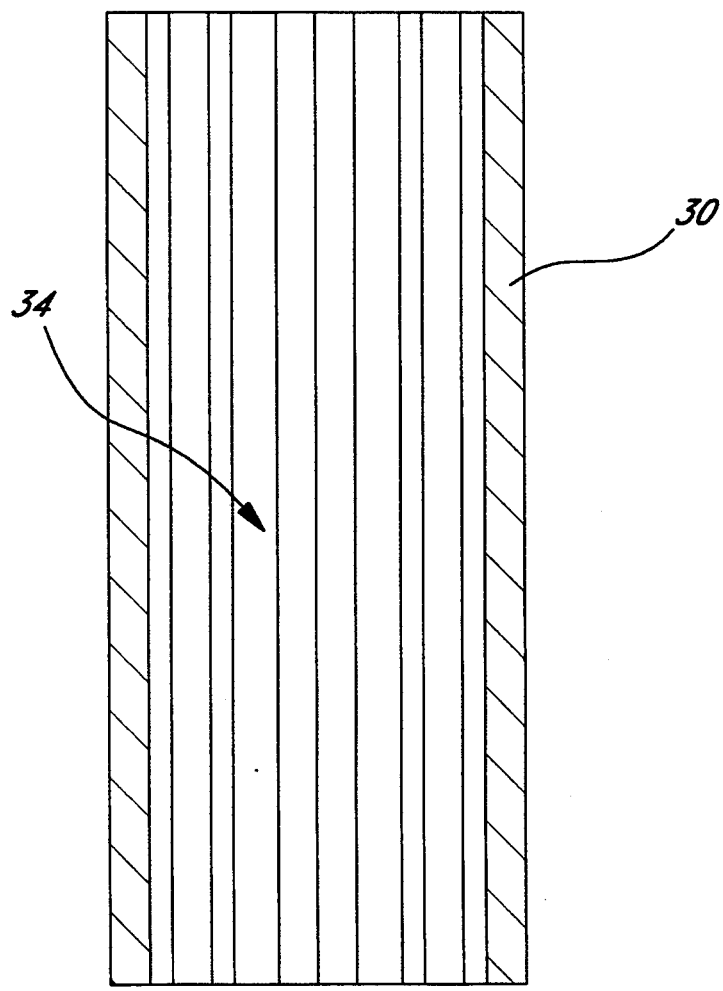
FIG. 9 is a cross-sectional view taken along line 9—9 of FIG. 8.

The housing 30 has an outer shape in the form of a hexagonal structure to provide corner segments 64 which are received within the channels 60 of the body receptacle 32. As best shown in FIGS. 8 and 9, the housing receptacle 34 has a similar configuration to that of the body receptacle 32, except its dimensions differ. This housing receptacle 34 is also formed by two hexagonal structures rotated 30° relative to each other to provide a receptacle having a 12 pointed star-like cross-section. The longitudinal axis b of the housing 30 and the longitudinal axis c of the housing receptacle 34 are offset relative to each other approximately 0.005 inch. There is a mark or indicia 63 on the rim 30a of the housing which serves as a visual reference when positioning the housing 30 in the body receptacle 32. As illustrated in FIGS. 3 and 7, the housing 30 slides into the body receptacle 32, with the corner segments 64 of the housing 30 being received in 6 of the 12 channels of the body receptacle. The housing 30 is manually removed, rotated in 30° increments, and reinserted into the body receptacle 32 to change the position of the locating pin 20.

Figure 10:
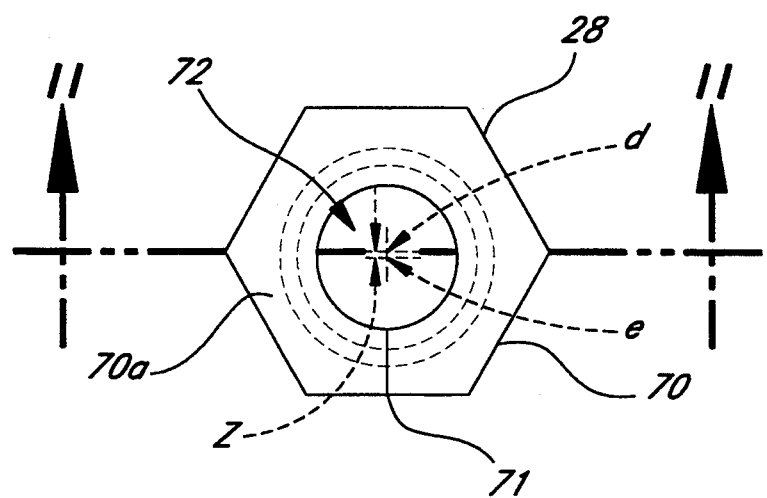
FIG. 10 is a plan view of the locating pin mounting member, with the locating pin removed.
Figure 11:
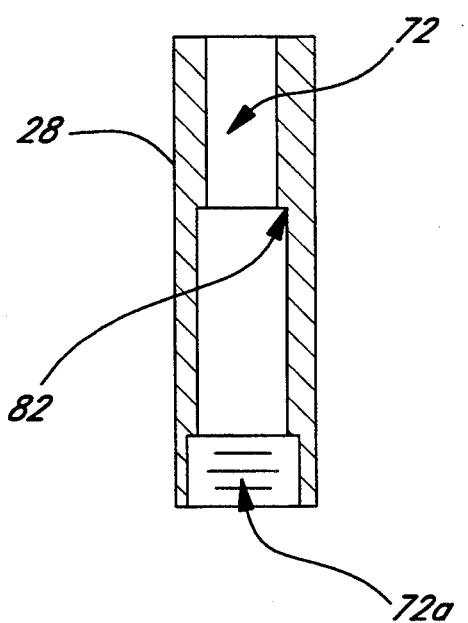
FIG. 11 is a cross-sectional view taken along line 11—11 of FIG. 10.

The locating pin mounting member 28 includes a hexagonal-shaped holder 70 as shown in FIGS. 3, 10, and 11, which has a central opening 72 running lengthwise through this holder. The opening 72 has a step 82 in its wall and its lower portion 72a (FIG. 11) is threaded. There is a cap 74 which is mounted to the bottom of the holder 72 and is received within the cavity 38 of the cover 26c. This cap 74 includes a V-shaped, annular groove 76, with the ball 52 bearing against this groove when the holder 70 is inserted into the cavity 38. The central longitudinal axis e of the opening 72 is offset with respect to the longitudinal axis d of the holder 70. Thus the locating pin 20 is off center with respect to the mounting member 28.

The locating pin 20 has an annular groove 78 in its lower portion, with a C-ring 80 snapped into position in this groove. A spring 84 is received within the opening 72 and a set screw 86 passes through the cap 74 and is screwed into the threaded, lower portion 72a of the opening 72. The spring 84 is biased to push the locating pin 20 outward, and the C-ring 80 engages the step 82 to hold the pin 20 so that it will not inadvertently be released from the mounting member 28. Thus, the locating pin 20 can be depressed to move it downward into the opening 72. When the locating pin 20 is aligned with the opening 18 in the circuit board 16, the spring 84 forces the pin upward into and through the opening 18.

The mounting member 28 may be manually removed from its position within the housing receptacle 34, and then repositioned within this receptacle by simply rotating it and reinserting it into the receptacle. There is a mark or indicia 71 on the rim 70a of the holder 70 which serves as a visual reference when positioning the mounting member 28 in the housing receptacle 34.

OPERATION

Table 1 and FIGS. 12A through 15B illustrate the manner in which the tooling pin of this assemblies 10 and 10a are used to compensate for minor irregularities in the test sites 24.

Figure 14:
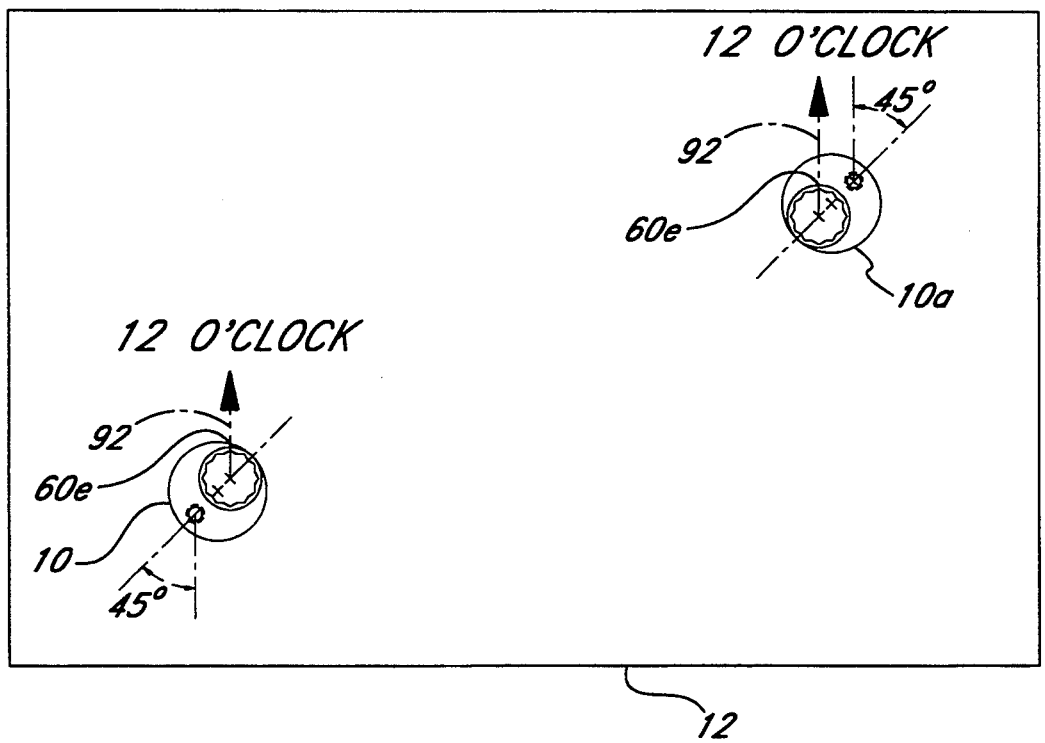
FIG. 14 is a plan view showing the location and orientation on a test platen of a pair of tooling pin assemblies of this invention.

As depicted in FIGS. 7 and 14, the orientation of the assemblies 10 and 10a are preset so that the same identically located channel, for example channel 60e, of the receptacles 32 coincide with an imaginary hour hand 92 pointing to 12 o'clock. The assemblies 10 and 10a are positioned so that they are oriented at, typically, 45° to the array of probes 22. With the assemblies 10 and 10a positioned in this manner, the user may manually reposition the housings 30 in the receptacles 32, or the locating pin mounting members 28 in the housing, or both.

Figure 13:
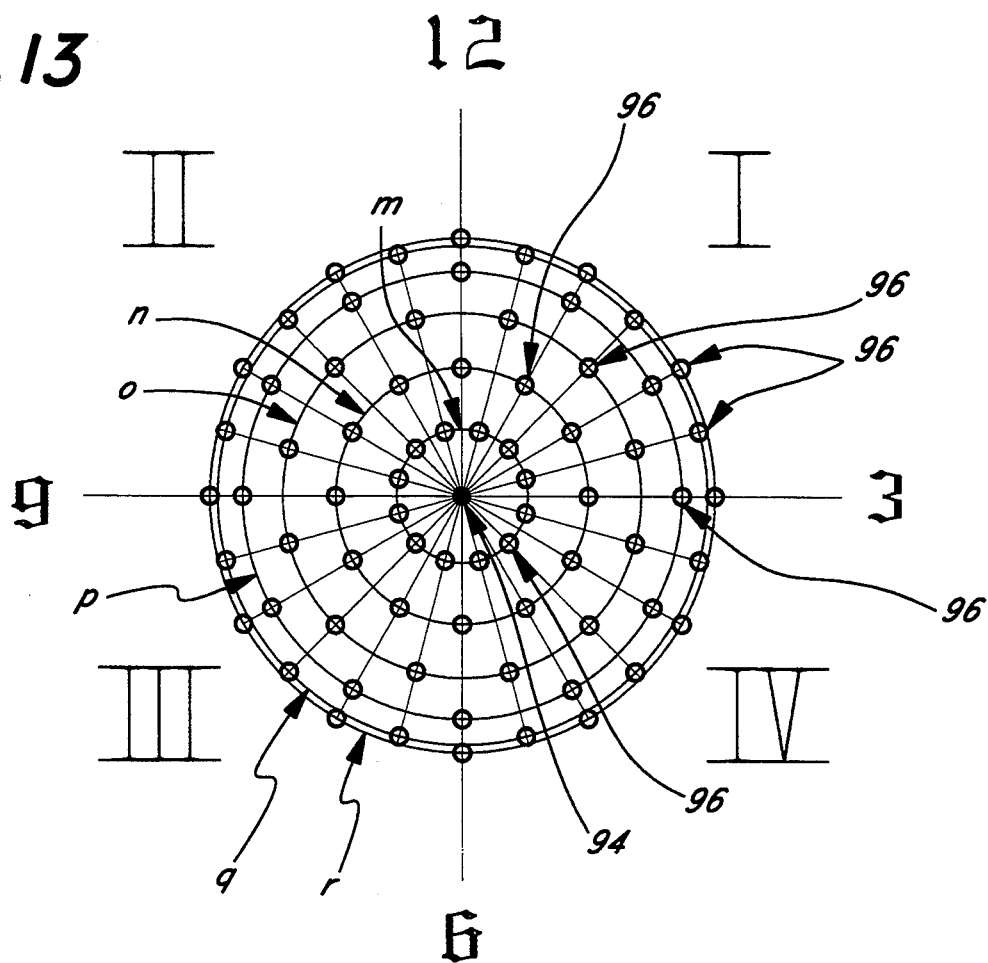
FIG. 13 is a schematic diagram showing the different, fixed positions at which the locating pin may be positioned precisely and repeatedly.

As illustrated in FIG. 13, the locating pin 20 may be moved from a central, standard position 94 to any one of seventy-two alternate, predictable, known positions 96 located at five different radial distances m, n, o, p, q, and r from the position 94. A constant offset distance Z of 0.005 inch as shown in FIGS. 8 and 10 is used in the preferred embodiment, but this may be changed as required for a particular testing situation. For the specific 0.005 inch offset relationships between the axis d and e and axis b and c, the radial distances are as follows: $m=0.0026$ inch, $n=0.0050$ inch, $o=0.0071$ inch, $p=0.0087$ inch, $q=0.0097$ inch, and $r=0.0100$ inch. FIG. 13 is divided into four quadrants: I corresponding to 3 to 12 o'clock; II corresponding to 12 to 9 o'clock; III corresponding to 9 to 6 o'clock; and IV corresponding to 6 to 3 o'clock.

Figure 12A:
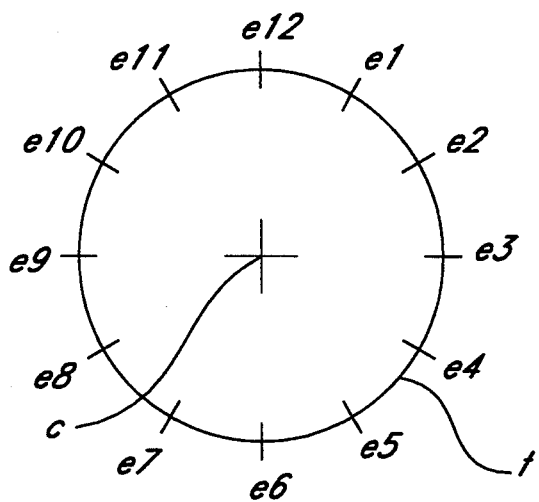
FIG. 12A and FIG. 12B are schematic views illustrating the double eccentric path along which the alternate positions of the locating pin are disposed.
Figure 12B:
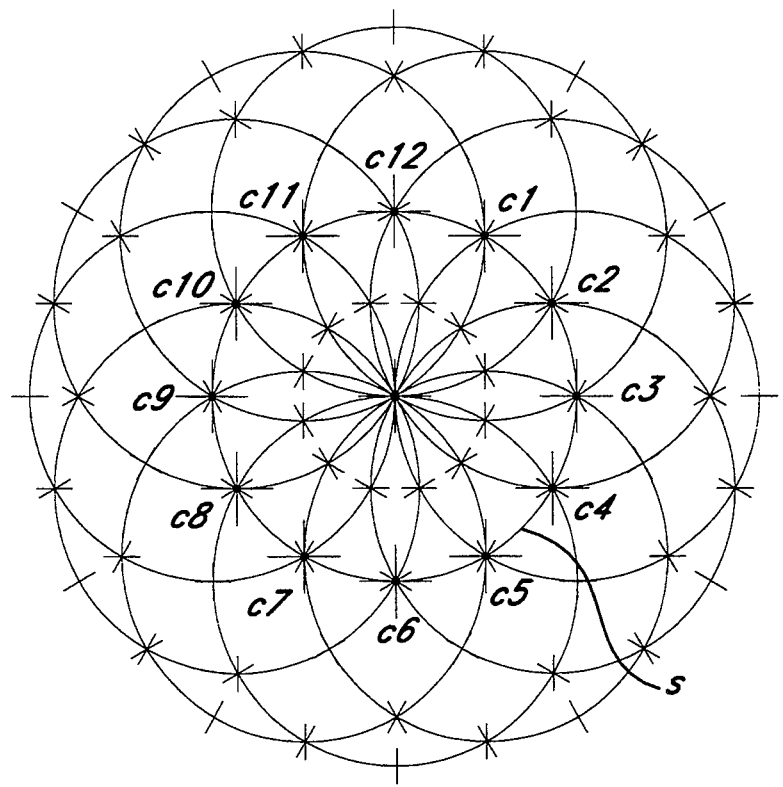

As depicted in FIG. 12A, the longitudinal axis e of the locating pin 20 may be repeatedly repositioned manually to different precise, fixed locations e1 through e12 along an eccentric orbit or path t about the offset axis c, and, as depicted in FIG. 12A, the offset axis c may be repeatedly repositioned manually to different precise, fixed locations c1 through c12 along an eccentric orbit or path s about the common axis a. The indicia 63 on the housing 30 and the indicia 71 on the locating pin mounting member 28 enable the user to determine the relative positions of the housing 30, locating pin mounting member 28, and the receptacle 32, and which one of the seventy-two alternate positions 96 the pin should be placed into in order to compensated for test site irregularities. This is accomplished with the aid of the following Table I.

Figure 15A:
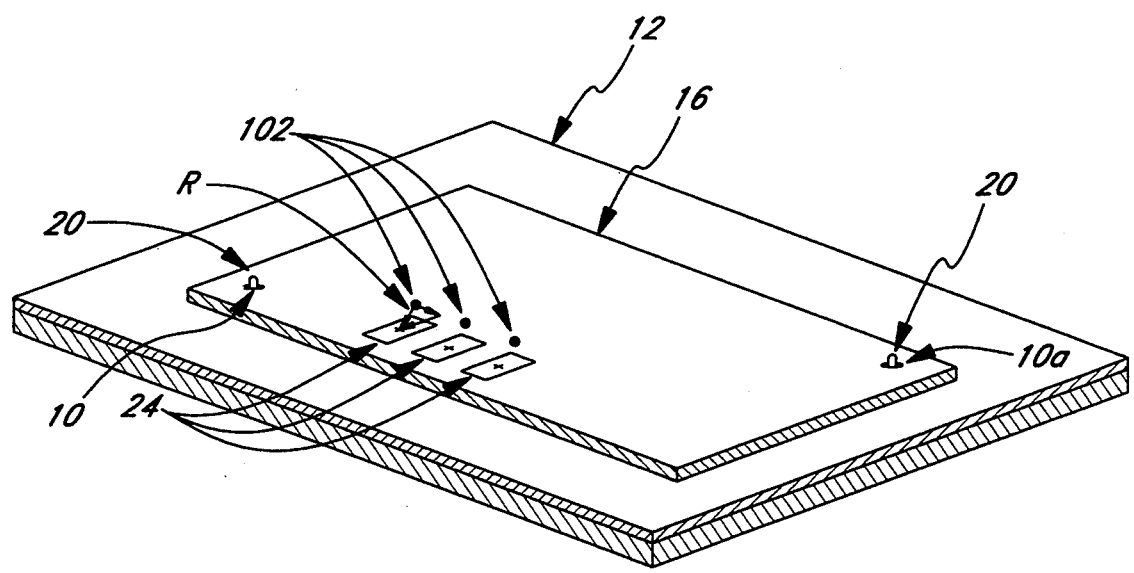
FIG. 15A schematically depicts the positions of probes which are not in alignment with test sites on a circuit board.

To illustrate the use of Table I, consider the problem faced by the misalignment of probes 22 (not shown in FIG. 15A for clarity) and test sites 24 depicted in FIG. 15A. Determination of the probe positions is accomplished using conventional techniques, for example, placing carbon paper (not shown) underneath the probes 22 between the tips 22a and the surface of the circuit board 16. Where the tips 22a touch the carbon paper, dots 102 remain on the surface of the circuit board 16. The dots 102 show the user the relative positions of the probes 22 and the test sites 24. In this example, the probes 22 are above and to the right of the test sites 24 as illustrated by the position of the dots 102. The user then measures the offset or resultant vector R, the direction and distance the probes 22 would have to be moved to align them with the test sites 24. A suitable eye piece type measuring device such as one sold under the trademark Lupe is an acceptable tool to accomplish the distance measurement. Table I has a column with the heading Q for the one of the four quadrants of FIG. 13, a column with the heading CLK corresponding to a position on a clock, and a column with the heading OFST corresponding to the resultant distance R (inches) to be moved. The column with the headings X and Y correspond to the vector components of the resultant distance R, which is equal to the sum of its vector components, namely, X and Y.

Figure 15B:
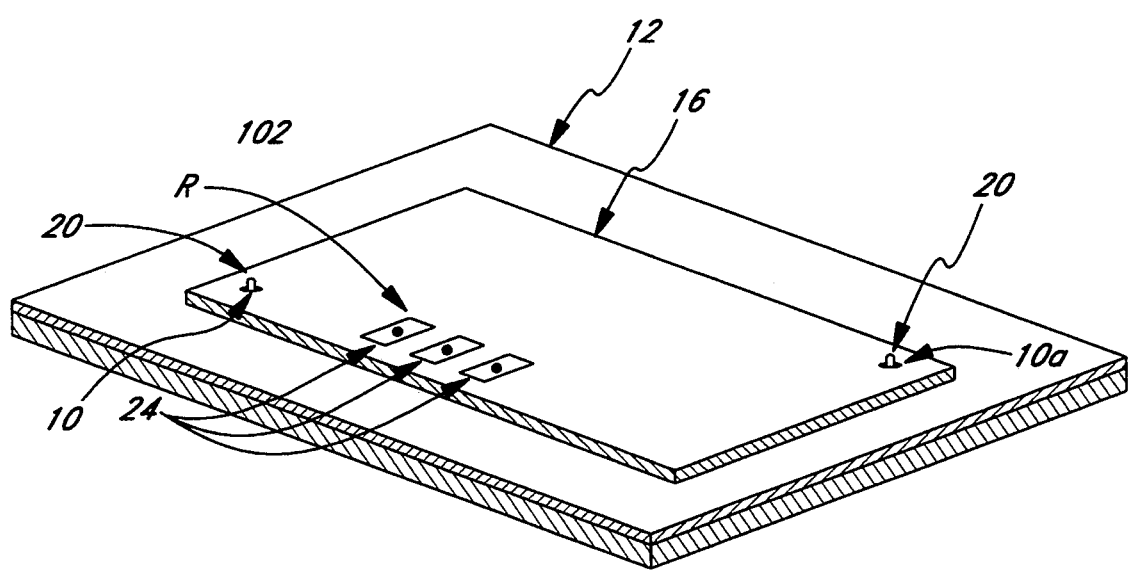
FIG. 15B schematically depicts the positions of the probes shown in FIG. 15A after repositioning the locating pin in accordance with this invention.

Assume the locating pin 20 is at the position 94 and the measurement of the resultant distance R made by the user is equal to 0.0097 inch. This means that the locating pin 20 needs to be moved from the position 94 to a new location at the radial distance q from the position 94. The location of the dots 102 above and to the right of the test sites 24 informs the user that the probes must be moved down a distance Y and to the left a distance X, or along the vector R a distance 0.0097 inch into the III quadrant to the 9:10 o'clock, 8:05 o'clock, or 7:00 o'clock positions according to the time position opposite 0.0097 in quadrant III. Any one of these three new locations may result in the correct alignment of the probes 22 with the test sites 24. The user, for example, repositions the housing 30 and locating pin mounting member 28 to the positions shown in FIG. 7, so that the indicia 63 (the minute position) and indicia 71 (the hour position) indicate 8:05 o'clock. Proper alignment will result in the circuit board 16 being relocated on the platen 12 as shown in FIG. 15B. If proper alignment is not provided with this adjustment, one of the other "times" is selected, for example, 9:10 o'clock. Provided that the irregularities are not gross defects, a relocation of the locating pin 20 will result in correct registration of the probes 22 and test sites 24. Typically, in the embodiment disclosed using an offset Z of 0.005 inch, if the irregularities are within 0.010 inch, repositioning of the locating pin 20 in accordance with this invention will result in correct alignment of the probes 22 and test sites 24.

SCOPE OF THE INVENTION

The above presents a description of the best mode contemplated of carrying out the present invention, and of the manner and process of making and using it, in such full, clear, concise, and exact terms as to enable any person skilled in the art to which it pertains to make and use this invention. This invention is, however, susceptible to modifications and alternate constructions from that discussed above which are fully equivalent. Consequently, it is not the intention to limit this invention to the particular embodiment disclosed. On the contrary, the intention is to cover all modifications and alternate constructions coming within the spirit and scope of the invention as generally expressed by the following claims, which particularly point out and distinctly claim the subject matter of the invention:

I claim:

1. A tooling pin assembly adapted to be mounted on a platen having a surface which supports an object, said tooling pin assembly including a locating pin which engages the object to fix the relative position of predetermined test sites on the object and a work element having probes that contact said sites during engagement when said object and work element are in correct alignment, said tooling pin assembly including a body member having a predetermined location and orientation on the platen and a first receptacle with a first side wall including a plurality of parallel first channels disposed substantially parallel to a first receptacle longitudinal axis which is centrally located and is substantially at a right angle to said surface upon mounting the tooling pin assembly to the platen, a housing which is removably disposed within the first receptacle and has first locating indicia thereon and an outer side wall including a plurality of corner segments that engage said first channels in the first receptacle and slide along said first channels upon relative sliding movement between the housing and the first receptacle, the position of the housing within the first receptacle being manually changeable as required to align correctly the object and the work element, with the position of the first locating indicia providing a visual indication of the position of the housing within the first receptacle, said housing having a second receptacle with a second side wall including a plurality of parallel second channels disposed substantially parallel to a second receptacle longitudinal axis that is substantially at a right angle to the surface upon mounting the tooling pin assembly to the platen, said second receptacle longitudinal axis being offset relative to a central longitudinal axis of the housing, a locating pin mounting member including said locating pin, said locating pin mounting member being removably disposed within the second receptacle and having second locating indicia thereon, an outer side wall including a plurality of corner segments that engage said second channels and slide along said second channels upon relative sliding movement between the locating pin mounting member and the second receptacle, and a third longitudinal axis that is substantially at a right angle to the planar surface upon mounting the tooling pin assembly to the test platen, said locating pin being coaxial with the third longitudinal axis, and said third longitudinal axis being offset relative to a central longitudinal axis of the locating pin mounting member.

2. The tooling pin assembly of claim 1 where the parallel channels in the first side wall are formed by a pair of coaxial hexagonal shaped wall structures rotated relative to each other 30°.

3. The tooling pin assembly of claim 1 where the parallel channels in the second side wall are formed by a pair of coaxial hexagonal shaped wall structures rotated relative to each other 30°.

4. The tooling pin assembly of claim 1 where the outer side wall of the housing has a hexagonal configuration.

5. The tooling pin assembly of claim 1 where the outer side wall of the locating pin mounting member has a hexagonal configuration.

6. The tooling pin assembly of claim 1 where the locating pin is spring biased.

7. The tooling pin assembly of claim 1 where the locating pin is in a fixed position within the locating pin mounting member.

* * * * *